United States Patent [19]
Lutes

[11] Patent Number: 4,590,426
[45] Date of Patent: May 20, 1986

[54] $B_{zz}$ AND $B_{yz}$ SENSE LOOP GEOMETRIES FOR CYLINDRICAL TENSOR GRADIOMETER LOOP STRUCTURES

[75] Inventor: Charles L. Lutes, Farmington, Minn.

[73] Assignee: Sperry Corporation, New York, N.Y.

[21] Appl. No.: 559,580

[22] Filed: Dec. 8, 1983

[51] Int. Cl.[4] .......................................... G01R 33/02
[52] U.S. Cl. ........................................ 324/248; 29/599; 29/847; 307/306; 324/260; 335/213; 335/216; 335/219; 336/208; 336/DIG. 1
[58] Field of Search ............... 324/244, 247, 248, 249, 324/252, 260, 261; 336/200, 217, 208, DIG. 1; 29/599, 847, 156, 427; 335/216, 209, 219, 213; 235/92 D; 323/360; 361/12 D; 307/306

[56] References Cited

U.S. PATENT DOCUMENTS

| | | | |
|---|---|---|---|
| 3,011,247 | 12/1961 | Hanlet | 336/200 X |
| 3,515,979 | 6/1970 | Golay | 336/200 X |
| 3,522,568 | 8/1970 | Hasbrouck | 336/200 X |
| 3,587,019 | 6/1971 | Bull | 336/200 |
| 3,772,587 | 11/1973 | Farrand et al. | 336/200 X |
| 4,231,008 | 10/1980 | Krueger | 335/216 X |
| 4,280,095 | 7/1981 | Hinton | 324/248 |
| 4,320,341 | 3/1982 | Lutes | 324/248 |

FOREIGN PATENT DOCUMENTS

| | | | |
|---|---|---|---|
| 1487946 | 7/1966 | France | 336/200 |
| 1534911 | 6/1967 | France | 336/200 |

OTHER PUBLICATIONS

Wynn et al., "Advanced Superconducting Gradiometer/Magnetometer Arrays and a Novel Signal Processing Technique", IEEE Trans. on Mag., vol. MAG-11, No. 2, Mar. 1975, pp. 701-707.

Bull, "Printed Scanning Coils", Wireless World, Aug. 1968, pp. 260-262.

Primary Examiner—Gerard R. Strecker
Assistant Examiner—Warren S. Edmonds
Attorney, Agent, or Firm—William C. Fuess; Glenn W. Bowen

[57] ABSTRACT

Each of two sensor loop patterns on a cylindrical substrate produces one of, specifically $B_{zz}$ and $B_{yz}$, of the five independent magnetic tensor gradiometer outputs as pure terms, meaning respectively dependent only upon $g_{zz}$ and $g_{yz}$, with no admixture of other gradient terms, specifically without admixture of $g_{xx}$. Such magnetic tensor gradiometer outputs are received at a current sensor device, nominally a superconducting quantum interference device (SQUID). Each of the two sensor loop patterns is of ten segments, and is a continuous closed-loop superconducting path save only for the single break point at which the current sensor device is coupled.

8 Claims, 15 Drawing Figures

PRIOR ART

Fig. 4

PRIOR ART

$B_{zz}$ AND $B_{yz}$ SENSE LOOP GEOMETRIES FOR CYLINDRICAL TENSOR GRADIOMETER LOOP STRUCTURES

BACKGROUND OF THE INVENTION

Superconducting magnetic sensor technology is based on the fact that some materials lose all of their electrical resistance and exclude all external magnetic fields when they are cooled below a critical temperature. External magnetic fields are excluded by electrical currents which develop within the material, which in turn generates a magnetic field opposing and exactly canceling locally the external field. The absence of all electrical resistance results in the absence of thermally generated electrical noise. Because of this phenomena a superconducting loop of wire will carry an electrical current proportional to any externally applied field. The current in a closed loop can be measured (i.e., converted to a voltage) using a Superconducting Quantum Interference Device (SQUID) which is a device utilizing the Josephson effect discovered by Brian Josephson.

A magnetic field is a vector quantity, i.e., possessing both direction and magnitude. A single loop superconductor mounted on a plane will measure the vector field component normal to the plane. A vector magnetometer (i.e., a device that measures the 3 vector components of the local magnetic field) can be constructed by implementing three loops, one on each of three orthonormal planes.

In many applications the spatial derivatives of the magnetic field vector components are of interest. Each of the vector field components have 3 spatial derivatives forming a total of 9 components usually denoted as the elements of a second order tensor as $$G = \begin{pmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{pmatrix}$$

Magnetic field properties dictate that the gradient tensor be symetric and traceless. Thus, the gradient tensor is completely specified by 3 off-diagonal components and 2 diagonal components. A diagonal component of the gradient tensor may be sensed by two superconductor loops which are separated and wherein the planes of such loops are coplanar. An off-diagonal component of the gradient tensor may be sensed by two superconductor loops which are separated in the same plane, which plane is orthornormal to each of those coplanar planes formed by those superconductor loops which do sense the diagonal component(s) of the gradient tensor.

One prior art structure for holding thirteen superconductor loops in a planar relationship so that the entire gradient tensor may be derived from the sensing of such loop physically resembles an "iron cross". The sensitivity of the gradiometer so implemented in an "iron cross" physical configuration is proportional to the area of the loops times the separation distance between the loops. Because this sensitivity coefficient has dimensions of length cubed it is termed a volume coefficient. The areas of each of the two loops for each gradiometer component must be identical. If they are not identical the output of the sensor will be proportional to a mixture of both gradient and field components. Because of these dependencies on separation distances and loop areas, the "iron cross" configuration gradiometer needs have physical dimensions which are poorly adaptable in size and form to most cryogenic dewars which are possessed of a cylindrical volume. When the "iron cross" configuration gradiometer is scaled to fit a given cylindrical dewar volume, then the gradiometer's sensitivity (i.e., the volume coefficients of each gradiometer) is smaller than that achievable using a cylindrical configuration for the gradiometer.

Such a cylindrical configuration gradiometer is also known in the prior art. Upon the surface of such a cylindrical configuration gradiometer it is known to create as few as five superconducting loop windings from the sensing of which such windings the entire gradient tensor may be resolved. The local magnetic gradient at the gradiometer can be represented by the independent gradient values $g_{xx}$, $g_{zz}$, $g_{xy}$, $g_{yz}$, and $g_{xz}$—but these values are not obtained directly from the five gradiometer windings but are rather only derived therefrom. The sensor outputs for the five superconducting loop gradiometer windings are represented as $B_{xx}$, $B_{zz}$, $B_{xy}$, $B_{zy}$, and $B_{zz}$. The relationship between the gradient values and the sensor outputs are a function of the physical loop winding geometries. In particular, in the prior art it is known to create two of these five loop windings, specifically the loop windings which sense $B_{zz}$ and $B_{yz}$, in a pattern so that these loop windings are, respectively, sensitive to measure not only $g_{zz}$ and $g_{yz}$ gradients but these loop windings do also, each one, measure significant additive quantities of $g_{xx}$ in their outputs. For simplicity of processing the signals derived from the loop windings in derivation of all forms of the gradient tensor, and in order that error contributions from the measurement of $g_{xx}$ should not affect the sensor outputs $B_{zz}$ and $B_{yz}$, it is desirable that the sensor loop pattern of a cylindrical tensor gradiometer should be improved.

SUMMARY OF THE INVENTION

The present invention relates generally to tensor gradiometers. The invention relates specifically to the geometries of sensor loop patterns on a cylindrical substrate for producing two of the five independent magnetic tensor gradiometer outputs (specifically $B_{zz}$ and $B_{yz}$) as pure terms with no admixture of other gradient terms for use with superconducting quantum interference devices (SQUID).

The present invention provides an improved implementation of tensor gradiometer loop structures on a cylindrical substrate. The prior art implementation of the $B_{zz}$ and $B_{yz}$ sense loops have large $g_{xx}$ (thereby $B_{xx}$) admixture terms. An improved method of implementing $B_{zz}$ and $B_{yz}$ with no $g_{xx}$ ($B_{xx}$) admixture terms is shown. This is accomplished by changing the prior art loop patterns for the $B_{zz}$ and $B_{yz}$ sense loops.

Specifically, when the radius of the cylindrical substrate equals "a" and with the length of such substrate, greater than "l", then a gradiometer loop of ten segments may be created upon the cylindrical substrate in electrical interconnection of nine points each of which points has coordinates upon said cylindrical substrate of the form (d, $\phi$) where d is the displacement 0 to l along the axis of the cylindrical substrate and where $\phi$ is the angle in radians from 0 to $2\pi$ which is subtended by an arc of the circumference of said cylindrical substrate. The nine electrically interconnected points defining the closed gradiometer loop are point 1 at coordinates $(0, \theta)$ to
point 2 at coordinates $(b, \theta)$ to
point 2' at coordinates $(b', \theta')$ to
point 3 at coordinates $(l, \theta)$ to
point 4 at coordinates $(l, -\theta)$ to
point 5 at coordinates $(0, -\theta)$ to
point 6 at coordinates $(0, -\pi+\theta)$ to
point 7 at coordinates $(l, -\pi+\theta)$ to
point 8 at coordinates $(l, \pi-\theta)$ to
point 9 at coordinates $(0, \pi-\theta)$ returning to
point 1 at coordinates $(0, \theta)$.

Points 2 and 2' are given the same numerical designation, and are at essentially equal coordinates ($b=b'$, $\theta=\theta'$) save only that there is no direct electrical conductive path from point 2 to point 2'.

For the first closed gradiometer loop upon a cylindrical substrate of the present invention, $\theta$ is less than $\pi/2$, while $b=2l/\pi(\theta-\sin\theta\cos\theta)$. This is called the $B_{zz}$ gradiometer loop, and produces $B_{zz}=4a^2l \sin\theta \cos\theta g_{zz}$. Notice that admixture terms are eliminated, and $B_{zz}$ is solely dependent on $g_{zz}$. In the preferred embodiment of this first closed gradiometer loop upon a cylindrical substrate of the present invention, $\theta=\pi/4$ and thusly $b=l(\frac{1}{2}-1/\pi)$ while $B_{zz}=2a^2g_{zz}$.

For the second closed gradiometer loop upon a cylindrical substrate of the present invention, $\theta$ is less than $\pi/2$, and $b=2\theta l/\pi$. This is called the $B_{yz}$ gradiometer loop, and produces $B_{yz}-4a^2 \sin\theta \cos\theta g_{yz}$. Notice that admixture terms are eliminated, and $B_{yz}$ is solely dependent upon $g_{yz}$. In the preferred embodiment of this second closed gradiometer loop upon a cylindrical substrate of the present invention, $\theta=\pi/4$ and thusly $b=1/2$ while $B_{yz}=2a^2l g_{yz}$.

Correspondingly, it is a first object of the present invention to eliminate the $g_{xx}$ admixture term to the $B_{zz}$ and $B_{yz}$ gradiometers providing thereby the advantage of eliminating the requirements of special electronics to perform the separation after sensing.

It is a second object of the present invention to eliminate the $g_{xx}$ admixture term to the $B_{zz}$ and $B_{yz}$ gradiometers making it possible to produce partially populated gradiometers in which $g_{xx}$ and/or $g_{yz}$ are desired measurements.

It is a third object of the present invention to eliminate the $g_{xx}$ admixture term to the $B_{zz}$ and $B_{yz}$ gradiometers making it possible to retain a $g_{zz}$ and $g_{yz}$ sensor output when environmental conditions are such that the $B_{xx}$ sense loop either saturates or loses electronic lock in the SQUID loop.

It is a fourth object of the present invention to eliminate the $g_{xx}$ admixture term to the $B_{zz}$ and $B_{yz}$ gradiometers thereby allowing $B_{zz}$ and $B_{yz}$ sensors to be independently without having to consider decoupling requirements.

BRIEF DESCRIPTION OF THE DRAWINGS

FIG. 1 shows a simplified schematic of a prior art cryogenic magnetic sensor employing a superconducting quantum interference device (SQUID).

FIG. 2 shows a drawing of a prior art 3-axis superconducting magnetometer.

FIG. 3, consisting of FIG. 3a and FIG. 3b, shows a drawing of a prior art method of implementing a tensor diagonal, and an off-diagonal, superconducting tensor gradiometer components.

FIG. 6, consisting of FIG. 6a, through FIG. 6e, shows planar representations of the paths of prior art implementations of all 5 independent superconducting tensor gradiometer components on a cylindrical substrate.

FIG. 7, consisting of FIG. 7a, and FIG. 7b, shows planar representations of the paths on a cylindrical substrate of the preferred embodiment specific implementation of the $B_{zz}$ and $B_{yz}$ components of a superconducting tensor gradiometer.

FIG. 8, consisting of FIG. 8a and 8b, shows planar representations of the paths on a cylindrical substrate of the preferred embodiment general implementation of the $B_{zz}$ and $B_{yz}$ components of a superconducting tensor gradiometer.

DETAILED DESCRIPTION OF THE PREFERRED EMBODIMENTS

Figures 1, 2, 3A, 3B:
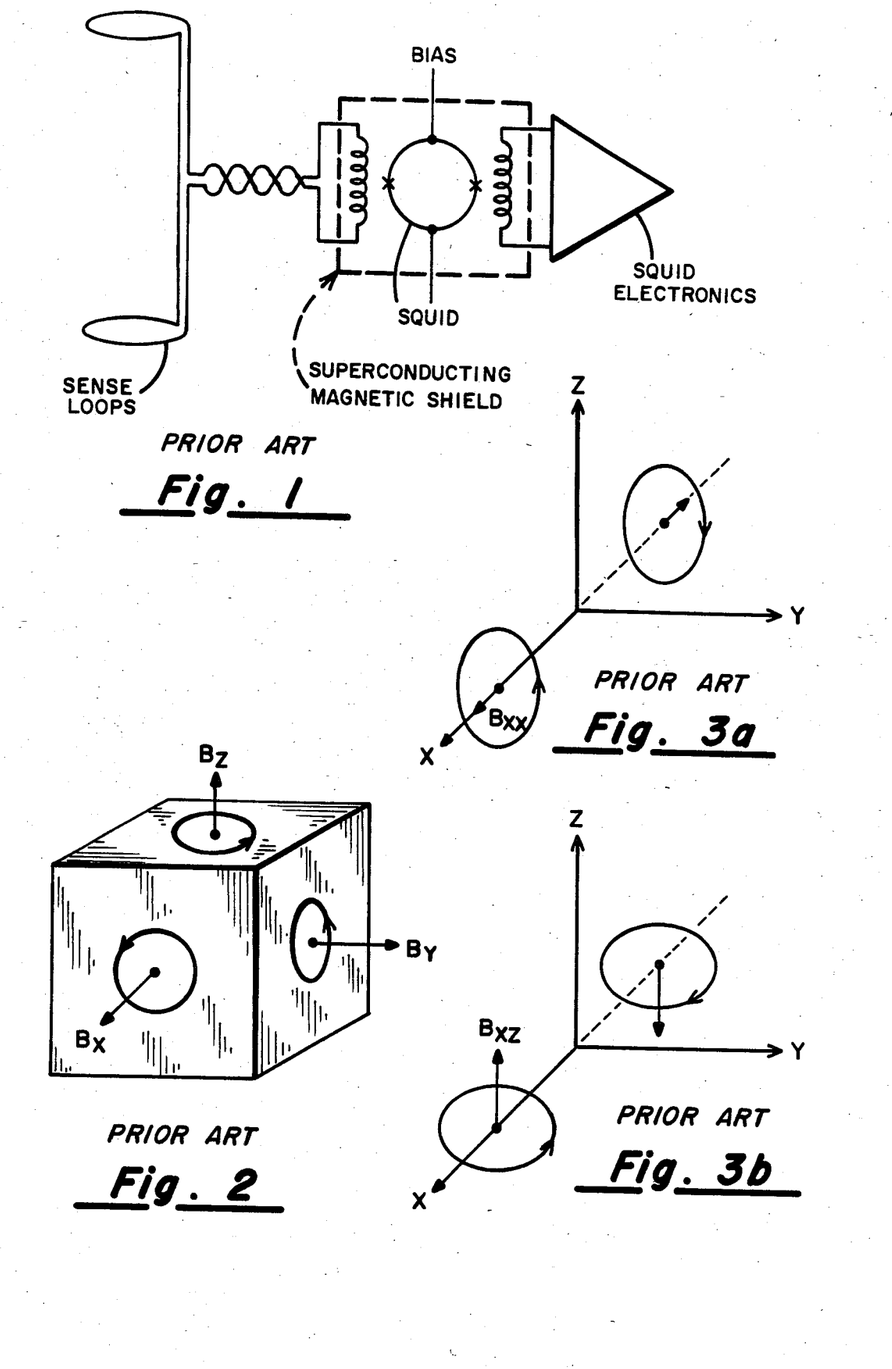

Superconducting magnetic sensor technology is based on the fact that many materials lose all of their electrical resistance and exclude all external magnetic fields when they are cooled below a critical temperature. External magnetic fields are excluded by electrical currents which develop within the material, which in turn generates a magnetic field opposing and exactly canceling locally the external field. The absence of all electrical resistance results in the absence of thermally generated electrical noise. Because of this phenomena a superconducting loop of wire will carry an electrical current proportional to any externally applied field. The current in a closed loop can be measured (i.e., converted to a voltage) using a Superconducting Quantum Interference Device (SQUID) which is a device utilizing the Josephson effect discovered by Brian Josephson. FIG. 1 shows a prior art embodiment of a SQUID detector.

A magnetic field is a vector quantity, i.e., possessing both direction and magnitude. A single loop superconductor mounted on a plane will measure the vector field component normal to the plane.

Thus a vector magnetometer (i.e., a device that measures the 3 vector components of the local magnetic field) can be constructed by implementing three loops, one on each of three orthonormal planes, as shown in prior art FIG. 2.

In many applications the spatial derivatives of the magnetic field vector components are of interest. Each of the 3 vector field components have 3 spatial derivatives forming a total of 9 components usually denoted as the elements of a second order tensor as $$G = \begin{pmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{pmatrix}$$

Figure 4:
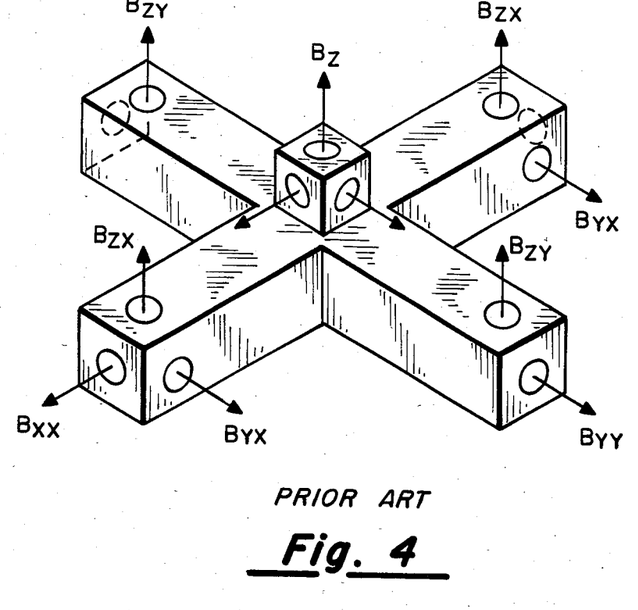
FIG. 4 shows a drawing of a prior art method of implementing a vector superconducting magnetometer and tensor 5-axis gradiometer sensor.

Magnetic field properties dictate that the gradient tensor be symetric and traceless. Thus, the gradient tensor is completely specified by 3 off diagonal components and 2 diagonal components. Prior art FIG. 3a and 3b respectively show a prior art superconducting implementation of a diagonal and off-diagonal gradient component. FIG. 4 shows a complete mechanization of all 3 magnetometer and 5 gradiometer components.

The prior art physical gradiometer/magnetometer array configuration shown in FIG. 4 is commonly called an "iron cross". It consists of 5 gradiometers and 3 magnetometers, and produces output terms $B_{xx}$, $B_{yy}$, $B_{zx}$, $B_{yx}$ and $B_{zy}$. The sensitivity of each gradiometer sensor implemented as shown in prior art FIG. 4 is proportional to the area of the loops times the separation distance between the loops. Because this sensitivity coefficient has dimensions of length cubed it is termed a volume coefficient. The areas of each of the two loops for each gradiometer component as shown in FIG. 3 and FIG. 4 must be identical. If they are not identical the output of the sensor will be proportional to a mixture of both gradient and field components.

The gradiometer configuration of FIG. 4 is poorly adaptable for the internal form factor of most cryogenic dewars which have a cylindrical volume. The configuration of FIG. 4 can be scaled to fit any cylindrical dewar volume, however, the gradiometers sensitivity (i.e., the volume coefficients of each gradiometer) would be smaller than that achievable using a cylindrical configuration.

Figure 5:
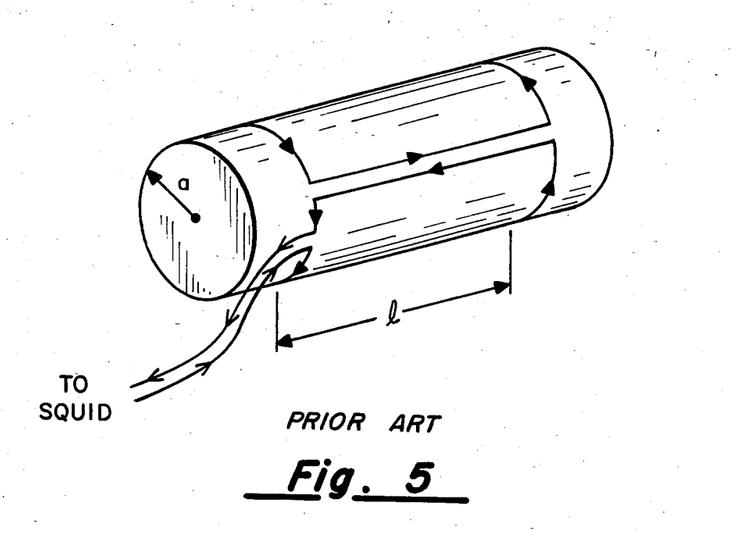
FIG. 5 shows a drawing of a prior art method of implementing a $B_{xx}$ superconducting tensor gradiometer component on a cylindrical substrate.

The prior art $B_{xx}$ gradiometer wound on a cylinder is shown in FIG. 5. With the radius of the cylinder equal to a and the distance between the loop windings equal to l then the volume coefficient is $a^2l$. The other gradiometer loops can also be implemented on the surface of a cylindrical substrate as is shown in FIG. 6. In FIG. 6 prior art windings have been drawn in a plane formed by unwrapping the surface of the cylinder and laying it out flat in order to more clearly show the windings. Only the main sense loop windings have been shown along with the required direction of winding; the required interconnections are not shown. A coordinate system has been assumed with x along the axis of the cylinder, z normal to x passing through 0 radians and y normal to x and z passing through $\pi/2$ radians.

Figure 6A:
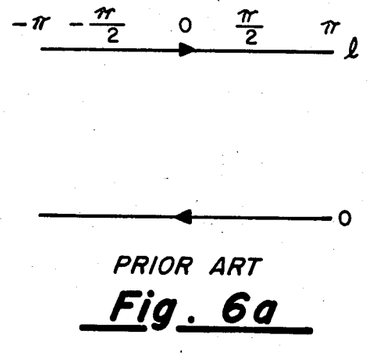

If the local gradient at the sensor can be represented by the 5 independent gradient values $g_{xx}$, $g_{zz}$, $g_{xy}$, $g_{yz}$, and $g_{xz}$, then the sensor outputs for the 5 prior art gradiometer windings shown in FIG. 6 in planar representation of the cylindrical surface are given by the following equations, each of which refers to the loop winding shown within the indicated Figure:

FIG. 6a:

$$B_{xx} = \pi a^2 l g_{xx}$$

Figure 6B:
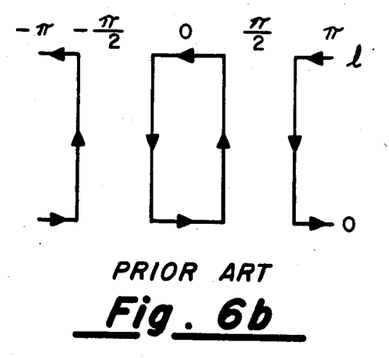

FIG. 6b:

$$B_{zz} = 2a^2l g_{zz} + a^2l(1-\pi/2)g_{xx}$$

Figure 6C:
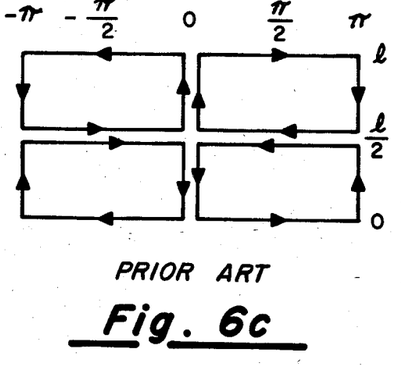

FIG. 6c:

$$B_{xy} = al^2 g_{xy}$$

Figure 6D:
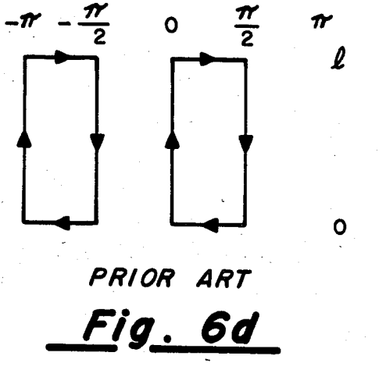

FIG. 6d:

$$B_{yz} = 2a^2l g_{yz} + \pi/2 a^2l g_{xx}$$

Figure 6E:
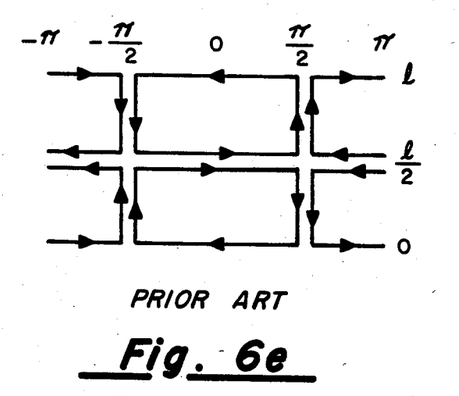

FIG. 6e:

$$B_{xz} = al^2 g_{xz}$$

Note that the $B_{zz}$ and $B_{yz}$ gradiometer windings do not measure just $g_{zz}$ and $g_{yz}$ gradients but both have significant additive quantities of $g_{xx}$ in their outputs.

The elimination of the $g_{xx}$ additive term to the $B_{zz}$ and $B_{yz}$ gradiometers provides the advantage of eliminating the requirements of special electronics to perform the separation after sensing, makes it possible to produce partially populated gradiometers in which $g_{xx}$ is not measured but in which $g_{zz}$ and/or $g_{yz}$ are desired measurements, makes it possible to retain a $g_{zz}$ and $g_{yz}$ sensor output when environmental conditions are such that the $B_{xx}$ sense loop either saturates or loses electronic lock in the SQUID loop and allows scaling the $B_{xx}$, $B_{zz}$ and $B_{yz}$ sensors independently without having to consider decoupling requirements.

Figure 7A:
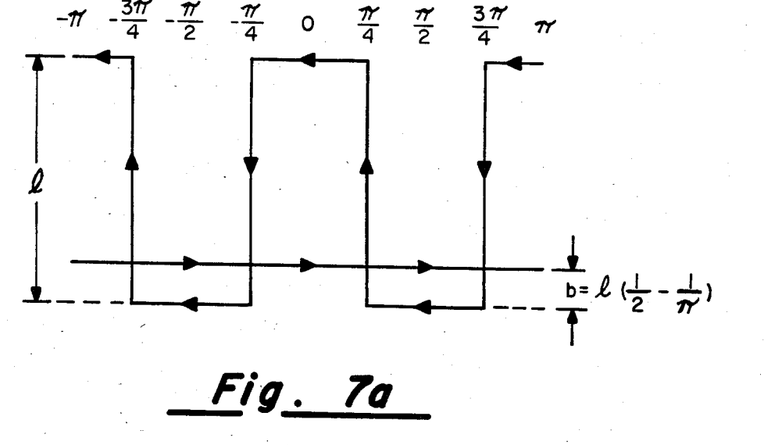
Figure 7B:
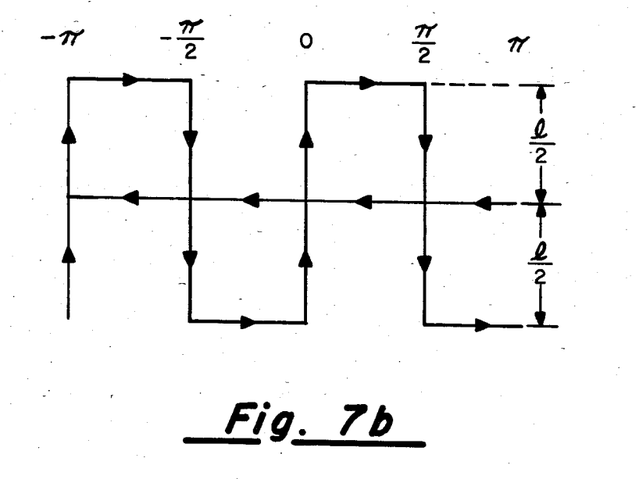

FIG. 7 shows, like as to FIG. 6 in planar representation of the cylindrical surface, the prefered embodiment of the present invention of $B_{zz}$ and $B_{yz}$ sense loops in which the additive $g_{xx}$ term is eliminated. The sensor outputs from the preferred embodiment loop windings shown in FIG. 7a and FIG. 7b are respectively given by the following equations:

FIG. 7a:

$$B_{zz} = 2a^2l g_{zz}$$

FIG. 7b:

$$B_{yz} = 2a^2l g_{yz}$$

The loop designs shown in FIG. 7 are specific examples of a more general class of designs allowing the implementation of $B_{zz}$, $B_{yy}$ and/or $B_{yz}$ sense loops without generating additive $B_{xx}$ components.

Figure 8A:
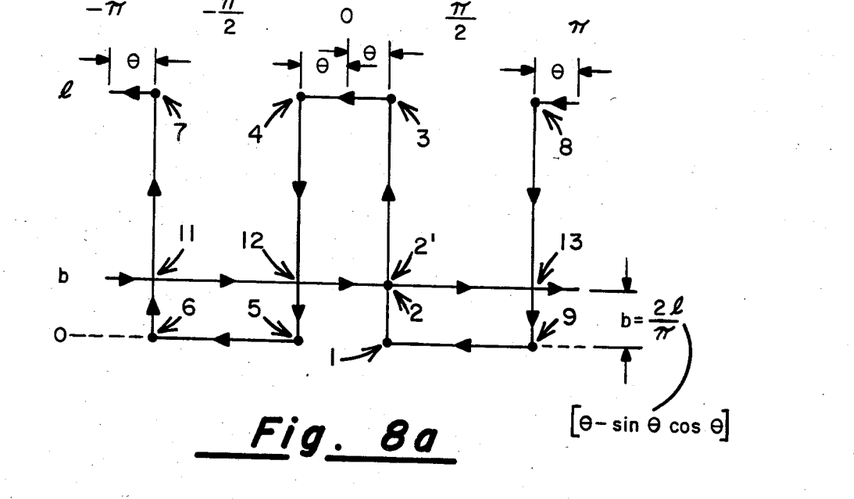
Figure 8B:
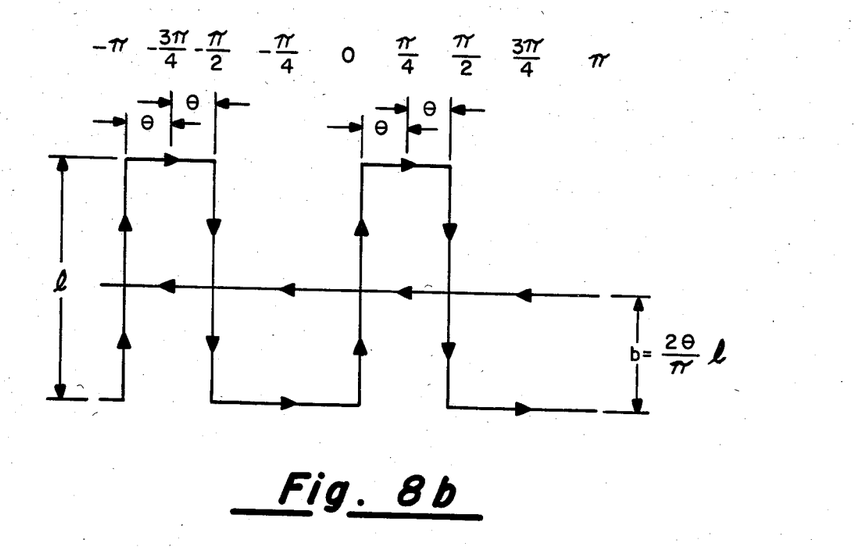

A more generalized design is shown in planar representation of the cylindrical surface in FIG. 8 in which the loop line segments along the cylindrical substrate length are not at coordinate octants, but at a general angle as defined in FIG. 8. The sensor outputs from the generalized embodiment loop windings of the invention shown in FIG. 8a and FIG. 8b are respectively given by the following equations:

FIG. 8a:

$$B_{zz} = 4a^2l \sin\theta \cos\theta g_{zz}$$

FIG. 8b:

$$B_{yz} = 4a^2l \sin\theta \cos\theta g_{yz}$$

The $B_{zz}$ gradiometer, shown in FIG. 8a, consists of a pair of interconnected superconducting windings on a cylindrical substrate. The SQUID is attached to the loop windings on the substrate via such as a superconducting twisted pair. The twisted pair is attached to the loop winding at any point. For the purpose of an example assume the attachment point to be at the point marked 1 in FIG. 8a which is at coordinates (0, $\theta$). The sense loop would then be wound in the following manner out of insulated superconducting wire. Superconducting electrical connection to one wire of the twisted pair from the SQUID would be brought from point 1 to point 2 at coordinate (b, $\theta$). From point 2, the wire would be wound completely around the cylinder back to point 2 of coordinate (b', $\theta$'). Point 2 and 2' are essentially the same point of coordinate (b=b', $\theta=\theta'$) save only that insulated superconducting wire, occupying space, cannot twice pass through the identical point and, indeed, due to such insulation the wire is not in direct electrical connection at the points 2 and 2'. The wire is then wound to point 3 at coordinate (1, $\theta$). The wire is then wound to point 4 at coordinate (1', $-\theta$) etc., proceeding:

to point 5 at coordinates (0, $-\theta$)
to point 6 at coordinates (0, $-\pi+\theta$)
to point 7 at coordinates (1, $-\pi+\theta$)
to point 8 at coordinates (1, $\pi-\theta$)
to point 9 at coordinates (0, $\pi-\theta$)
to point 1 at coordinates (0, $\theta$)

Upon returning to point 1 the wire is attached to the second wire of the twisted pair from the SQUID to complete the circuit. The superconducting wire is insulated so that shorts do not occur at the crossover points 2, 11, 12 and 13. The SQUID attachment point can be any place on the loop winding and is not restricted to point 1.

The $B_{yz}$ gradiometer is wound in the same way, the only difference in the $B_{zz}$ and $B_{yz}$ loops being a rotation of $\pi/4$ radians and the value of the b coordinate. A $B_{yy}$ gradiometer can be constructed by rotating the $B_{zz}$ gradiometer by $\pi/2$ radians. In this case the b coordinate has the same value for both the $B_{zz}$ and $B_{yy}$ gradiometers.

Both the first and the second generalized embodiment gradiometer loops of the present invention as are respectively shown in FIG. 8a and FIG. 8b are thus constructed of ten total segments electrically interconnecting nine total points (points 2 and 2' are counted as one point) in the same manner. In the first generalized embodiment gradiometer loop shown in FIG. 8a, angle $\theta$ is less than $\pi/2$ radians while length $b=2l/\pi(\theta-\sin\theta\cos\theta)$ which is necessarily less than l. By this relationship the $B_{zz}$ detected by the sensor is given by that equation previously stated for FIG. 8a. In the second generalized embodiment gradiometer loop shown in FIG. 8b, angle $\theta$ is necessarily less than $\pi/2$ radians while length $b=2\theta l/\pi$ which is necessarily less than l. By this relationship the $B_{yz}$ detected by the sensor is given by that equation previously stated for FIG. 8b.

FIGS. 7a and 7b are thereby seen to show special cases of FIG. 8a and 8b, respectively, in which cases $\theta$ has the value $\pi/4$. The largest possible volume coefficient, and therefore the most sensitive gradiometer, is achieved when $\theta$ has a value of $\pi/4$. Utilizing the generalized relationship between length b and angle $\theta$ for the generalized embodiment gradiometer loop of the first type (shown in FIG. 8a), it may be noted that $b=l(\frac{1}{2}-1/\pi)$ which is as shown in FIG. 7a, when $\theta=\pi/4$. Additionally, the $B_{zz}$ detected by the sensor is then given by that equation previously stated for FIG. 7a. Similarly, utilizing the generalized relationship between length b and angle $\theta$ for the generalized embodiment gradiometer loop of the second type (shown in FIG. 8b), it may be noted that $b=l/2$ which is shown in FIG. 7b, when $\theta=\pi/4$. Additionally, the $B_{yz}$ detected by the sensor is then given by that equation previously stated for FIG. 7b. Of course, given the fixed relationship between length b and angle $\theta$ for each of the two generalized embodiments of the invention, it is equally valid to consider b as the fixed variable and that variable $\theta$ is calculated relative to b. Therefore, it might alternatively be stated that FIGS. 7a and 7b are special cases of FIG. 8a and FIG. 8b, respectively, in which b assumes the respective values of $l(\frac{1}{2}-1/\pi)$ and $l/2$.

While the invention has been described in its preferred embodiment permitting the use of wires upon a cylindrical substrate, it is to be understood that the words which have been used are words of description rather than of limitations and that changes may be made within the perview of the dependent claims without departing from the true scope and spirit of the invention is its broader aspects. In particular, the teaching of the present invention that a gradiometer loop of each of two configurations, with all its attendant utility to eliminate admixture terms in the current sensed by such loops may be constructed upon a cylindrical substrate, does show a general method and apparatus of utility to the practitioner of the art of generating superconducting circuitry. In particular, it is not necessary that such loops be formed from wire because, for example, the gradiometer loops may be laid down as thin film depositions of conductive metal.

It is possible to implement either preferred embodiment of the present invention with minor variations which do not detract from the essential essence of the invention as expressed in the particular geometries for the creation of sense loop patterns for cylindrical tensor gradiometers. In particular, certain deviations from linearity—which deviations would normally be taken in a manner offsetting the amount of flux trapped within the gradiometer loop—may be taken in the line segments, normally straight, of preferred embodiment gradiometer loops of the present invention. Such deviations might be taken to provide balance trimming loops as taught in U.S. Pat. No. 4,320,341 for GRADIOMETER TRIMMING STRUCTURES to that selfsame C. Lutes who is the inventor of the apparatus herein disclosed. Such deviations might be taken to accommodate physical mounting features, such as screw holes. In all cases of implementing slightly variant embodiments of the loop structures of the present invention, the essential geometry of a serpentine path upon a cylindrical substrate with an intersecting circumferential loop upon such cylindrical substrate, which circumferential loop is adjusted in position to cancel the $g_{xx}$ additive term, will be present.

What is claimed is:

1. A superconducting loop path patterned upon a cylindrical substrate of radius a and of length l, which said loop path is of a particular geometry useful as a one sense loop within a five loop cylindrical tensor gradiometer, which said loop path is electrically continuous save only for one only break point anywhere upon said loop at which said break point said loop is broken and is electrically connected to a current sensor, said superconducting loop path of a particular geometry characterized in that said loop path is a segmented continuous, save for a break point anywhere upon said loop path which break point momentarily breaks continuousness of said loop path, electrically superconducting path made upon the surface of said cylindrical substrate in ordered interconnection of the following points, each which point is defined by the coordinates (d, $\phi$) wherein d is the displacement 0 to l along the axis of said cylindrical substrate and wherein $\phi$ is the angle in radians from $-\pi$ to $\pi$ which is subtended by an arc of the circumference of said cylindrical substrate:

point 1 coordinates (0, $\theta$) linearly in a first direction to point 2 coordinates (b, $\theta$) clockwise to point 2' coordinates (b', $\theta$') colinearly in said first direction to point 3 coordinates (l, $\theta$) counterclockwise to point 4 coordinates (l, $-\theta$) linearly oppositely to said first direction to point 5 coordinates (0, $-\theta$) counterclockwise to point 6 coordinates (0, $-\pi+\theta$) linearly in said first direction to point 7 coordinates (l, $-\pi+\theta$) counterclockwise to point 8 coordinates (l, $\pi-\theta$) linearly oppositely to said first direction to point 9 coordinates (0, $\pi-\theta$) counterclockwise returning to point 1 coordinates (0, $\theta$)

wherein the coordinates (b', $\theta$') of point 2' essentially equal the coordinates (b, $\theta$) of point 2 save only that within the superconducting path from point 1 to point 2, which point 2 is of essentially equal coordinates to point 2', and thence to point 3 the said point 2' is not in electrical connection with point 2;

wherein $\theta$ is less than or equal to $\pi/2$ radians;

wherein b equals $2l/\pi(\theta - \sin\theta\cos\theta)$; and wherein said electrically superconducting loop path of a particular geometry upon a cylindrical substrate is useful as one sense loop within a five loop cylindrical tensor gradiometer.

2. The superconducting loop path of a particular geometry of claim 1 further characterized in that $\theta = \pi/4$, and $b = l(\frac{1}{2} - 1/\pi)$.

3. A superconducting loop path patterned upon a cylindrical substrate of radius a and of length l, which said loop path is of a particular geometry useful as a one sense loop within a five loop cylindrical tensor gradiometer, which said loop path is electrically continuous save only for one only break point anywhere upon said loop at which said break point said loop is broken and is electrically connected to a current sensor, said superconducting loop path of a particular geometry characterized in that said loop path is a segmented continuous, save for a break point anywhere upon said loop path which momentarily breaks continuousness of said loop path, electrically superconducting path made upon the surface of said cylindrical substrate in ordered interconnection of the following points, each which point is defined by the coordinates (d, $\phi$) wherein d is the displacement 0 to l along the axis of said cylindrical substrate and wherein $\theta$ is the angle in radians from $-\pi$ to $\pi$ which is subtended by an arc of the circumference of said cylindrical substrate:

point 1 coordinates 0, $\theta$) linearly in a first direction to point 2 coordinates (b, $\theta$) clockwise to point 2' coordinates (b', $\theta$') colinearly in said first direction to point 3 coordinates (l, $\theta$) counterclockwise to point 4 coordinates (l, $-\theta$) linearly oppositely to said first direction to point 5 coordinates (0, $-\theta$) counterclockwise to point 6 coordinates (0, $-\pi+\theta$) linearly in said first direction to point 7 coordinates (l, $-\pi+\theta$) counterclockwise to point 8 coordinates (l, $\pi-\theta$) linearly oppositely to said first direction to point 9 coordinates (0, $\pi-\theta$) counterclockwise returning to point 1 coordinates (0, $\theta$)

wherein the coordinates (b', $\theta$') of point 2' essentially equal the coordinates (b, $\theta$) of point 2 save only that within the superconducting path from point 1 to point 2, which point 2 is of essentially equal coordinates to point 2', and thence to point 3 the said point 2' is not in electrical connection with point 2;

wherein $\theta$ is less than or equal to $\pi/2$ radians;

wherein b equals $2\theta l/\pi$; and wherein said electrically superconducting loop path of a particular geometry upon a cylindrical substrate is useful as a sense loop within a five loop cylindrical tensor gradiometer.

4. The superconducting loop path of a particular geometry of claim 3 further characterized in that $\theta = \pi/4$, and $b = 1/2$.

5. A method of implementing a sensor loop pattern of a tensor gradiometer upon a cylindrical substrate of radius a and of length greater than or equal to l which method comprises:

making a superconducting electrical path upon the surface of said cylindrical substrate substantially in sequence between the followig points—each point being defined by coordinates (d, $\phi$) wherein d is the displacement 0 to l along the axis of said cylindrical substrate and wherein $\phi$ is the angle in radians from $-\pi$ to $\pi$ which is subtended by an arc of the circumference of said cylindrical substrate—by commencing said path at point 1 coordinates (0, $\theta$), then first electrically connecting along said path parallel to the axis of said cylindrical substrate from point 1 coordinates (0, $\theta$) to point 2 coordinates (b, $\theta$) then second electrically connecting along said path completely around the cylinder from point 2 coordinates (b, $\theta$) to point 2' coordinates (b', $\theta$'), which coordinates (b', $\theta$') essentially equal coordinates (b, $\theta$) save only that said coordinates are different by such magnitude that point 2' is not in electrical continuity with point 2, then third electrically connecting along said path, in the same direction as said first connecting, by continuing parallel to the axis of said cylindrical substrate, from point 2' coordinates (b', $\theta$') to point 3 coordinates (l, $\theta$), then fourth electrically connecting along said path, in the opposite rotational direction to said second connecting, partially around said cylindrical substrate from point 3 coordinates (l, $\theta$) to point 4 coordinates (l, $-\theta$) then fifth electrically connecting along said path, parallel to the axis of said cylindrical substrate, from point 4 coordinates (l, $-\theta$) to point 5 coordinates (0, $-\theta$), then sixth electrically connecting along said path, in the opposite rotational direction to said second connecting, partially around said cylindrical substrate from point 5 coordinates (0, $-\theta$) to point 6 coordinates (0, $-\pi+\theta$), then seventh electrically connecting along said path, parallel to said axis of said cylindrical substrate, from point 6 coordinates (0, $-\pi+\theta$) to point 7 coordinates (l, $-\pi+\theta$), eighth electrically connecting along said path, in the opposite rotational direction to said second connecting, partially around said cylindrical substrate from point 7 coordinates (1, $-\pi+\theta$) to point 8 coordinates (1, $\pi-\theta$), ninth electrically connecting along said path, parallel to the axis of said cylindrical substrate, from point 8 coordinates (1, $\pi-\theta$) to point 9 coordinates (0, $\pi-\theta$), tenth electrically connecting along said path, in the opposite rotational direction to said second connecting, partially around said cylindrical substrate from point 9 coordinates (0, $\pi-\theta$) back to point 1 coordinates (0, $\theta$)

thereby forming a closed said path, or loop, in electrically connected segments; then breaking said closed path at one only break point anywhere thereupon said path, upon each side of which said one only break point electrical connection is made between said path and a current sensor;

wherein $\theta$ is less than $\pi/2$ radians wherein $b = 2l/\pi$ ($\theta - \sin \theta \cos \theta$) which is necessarily less than or equal to;

wherein said superconducting electrical path of particular geometry upon the surface of said cylindrical substrate is useful as a sense loop within a five loop cylindrical tensor gradiometer; and whereby said current sensor connected to each side of said one only break point breaking said path—which path is otherwise then said one only break point a closed path—the current flow within said segmented path may be sensed.

6. The method of implementing a sensor loop pattern of a tensor gradiometer upon a cylindrical substrate of claim 5 wherein $\theta = \pi/4$ and, consequently, $b = 1$ ($\frac{1}{2} - 1/\pi$).

7. A method of implementing a sensor loop pattern of a tensor gradiometer upon a cylindrical substrate of radius a and of length greater than or equal to l, which method comprises:

making a superconducting electrical path upon the surface of said cylindrical substrate and in sequence between the following points—each point being defined by coordinates (d, $\phi$) wherein d is the displacement 0 to l along the axis of said cylindrical substrate and wherein $\phi$ is the angle in radians from $-\pi$ to $\pi$ which is subtended by an arc of the circumference of said cylindrical substrate—by commencing said path at point 1 coordinates (0, $\theta$), then first electrically connecting along said path parallel to the axis of said cylindrical substrate from point 1 coordinates (0, $\theta$) to point 2 coordinates (b, $\theta$), then second electrically connecting along said path completely around the cylinder from point 2 coordinates (b, $\theta$) to point 2' coordinates (b', $\theta'$), which coordinates (b', $\theta'$) essentially equal coordinates (b, $\theta$) save only that said coordinates are different by such magnitude that point 2' is not in electrical continuity with point 2, then third electrically connecting along said path, in the same direction as said first connecting, by continuing parallel to the axis of said cylindrical substrate, from point 2' coordinates (b', $\theta'$) to point 3 coordinates (l, $\theta$), then fourth electrically connecting along said path, in the opposite rotational direction to said second connecting, partially around said cylindrical substrate from point 3 coordinates (l, $\theta$) to point 4 coordinates (l, $-\theta$), then fifth electrically connecting along said path, parallel to the axis of said cylindrical substrate, from point 4 coordinates (l, $-\theta$) to point 5 coordinates (0, $-\theta$), then sixth electrically connecting along said path, in the opposite rotational direction to said second connecting, partially around said cylindrical substrate from point 5 coordinates (0, $-\theta$) to point 6 coordinates (0, $-\pi+\theta$), then seventh electrically connecting along said path, parallel to said axis of said cylindrical substrate, from point 6 coordinates (0, $-\pi+\theta$) to point 7 coordinates (1, $-\pi+\theta$), eighth electrically connecting along said path, in the opposite rotational direction to said second connecting, partially around said cylindrical substrate from point 7 coordinates (1, $-\pi+\theta$) to point 8 coordinates (1, $\pi-\theta$), ninth electrically connecting along said path, parallel to the axis of said cylindrical substrate, from point 8 coordinates (1, $\pi-\theta$) to point 9 coordinates (0, $\pi-\theta$), tenth electrically connecting along said path, in the opposite rotational direction to said second connecting, partially around said cylindrical substrate from point 9 coordinates (0, $\pi-\theta$) back to point 1 coordinates (0, $\theta$)

thereby forming a closed said path, or loop, in segments; then breaking said closed path at one only break point anywhere thereupon said path, upon each side of which said one only break point electrical connection is made between said path and a current sensor;

wherein $\theta$ is less than or equal to $\pi/2$ radians;

wherein $b = 2 \theta l/\pi$ which is necessarily less than or equal to l;

wherein said superconducting electrical path of particular geometry upon the surface of said cylindrical substrate is useful as a sense loop within a five loop cylindrical tensor gradiometer; and whereby said current sensor connected to each side of said one only break point breaking said path—which path is otherwise than said one only break point a closed path—the current flow within said segmented path may be sensed.

8. The method of implementing a sensor loop pattern of a tensor gradiometer upon a cylindrical substrate of claim 7 wherein $\theta = \pi/4$ and, consequently, $b = 1/2$.

* * * * *